US008258632B1

United States Patent
Sullivan et al.

(10) Patent No.: US 8,258,632 B1
(45) Date of Patent: *Sep. 4, 2012

(54) OPTICALLY-INITIATED SILICON CARBIDE HIGH VOLTAGE SWITCH WITH CONTOURED-PROFILE ELECTRODE INTERFACES

(75) Inventors: James S. Sullivan, Livermore, CA (US); Steven A. Hawkins, Livermore, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/171,281

(22) Filed: Jun. 28, 2011

Related U.S. Application Data

(63) Continuation-in-part of application No. 12/952,949, filed on Nov. 23, 2010, now Pat. No. 8,125,089, which is a continuation of application No. 11/586,468, filed on Oct. 24, 2006, now Pat. No. 7,893,541.

(60) Provisional application No. 60/798,016, filed on May 4, 2006, provisional application No. 60/730,161, filed on Oct. 24, 2005, provisional application No. 61/359,012, filed on Jun. 28, 2010.

(51) Int. Cl.
*H01L 23/48* (2006.01)
*H01L 23/52* (2006.01)
*H01L 29/40* (2006.01)

(52) U.S. Cl. ............... 257/778; 257/82; 257/433

(58) Field of Classification Search .......... 257/80–87, 257/431–433, 777–782; 250/214, 551
See application file for complete search history.

(56) References Cited

U.S. PATENT DOCUMENTS

| | | | | |
|---|---|---|---|---|
| 3,532,843 A * | 10/1970 | Walter | ...... | 218/82 |
| 3,986,139 A * | 10/1976 | Meneely et al. | ...... | 372/83 |
| 4,147,955 A * | 4/1979 | King | ...... | 315/3.5 |
| 4,150,343 A * | 4/1979 | Seelig et al. | ...... | 372/60 |
| 4,198,590 A * | 4/1980 | Harris | ...... | 315/335 |
| 4,387,463 A * | 6/1983 | Rickwood | ...... | 372/86 |
| 4,550,408 A * | 10/1985 | Karning et al. | ...... | 372/58 |
| 4,612,642 A * | 9/1986 | Whitney et al. | ...... | 372/33 |
| 4,677,637 A * | 6/1987 | Karning et al. | ...... | 372/83 |
| 4,833,686 A * | 5/1989 | Eldridge | ...... | 372/87 |
| 5,146,141 A * | 9/1992 | Rohde | ...... | 315/326 |
| 5,220,575 A * | 6/1993 | Bosch et al. | ...... | 372/87 |
| 5,229,688 A * | 7/1993 | Branston et al. | ...... | 313/590 |
| 5,585,648 A * | 12/1996 | Tischler | ...... | 257/77 |
| 5,740,195 A * | 4/1998 | Murray et al. | ...... | 372/87 |
| 6,052,402 A * | 4/2000 | Murray et al. | ...... | 372/87 |
| 6,759,668 B2 * | 7/2004 | Matsuo et al. | ...... | 250/551 |
| 2003/0227061 A1 * | 12/2003 | Yokogawa et al. | ...... | 257/379 |

FOREIGN PATENT DOCUMENTS

| | | |
|---|---|---|
| JP | 61-042973 | 1/1986 |
| JP | 62-195181 | 8/1987 |
| JP | 2003-133575 | 9/2003 |
| WO | WO/95/31009 | 11/1995 |

* cited by examiner

*Primary Examiner* — Telly Green
(74) *Attorney, Agent, or Firm* — James S. Tak

(57) ABSTRACT

An improved photoconductive switch having a SiC or other wide band gap substrate material with opposing contoured profile cavities which have a contoured profile selected from one of Rogowski, Bruce, Chang, Harrison, and Ernst profiles, and two electrodes with matching contoured-profile convex interface surfaces.

2 Claims, 11 Drawing Sheets

OPTICALLY-INITIATED SILICON CARBIDE HIGH VOLTAGE SWITCH WITH CONTOURED-PROFILE ELECTRODE INTERFACES

I. CROSS-REFERENCES TO RELATED APPLICATIONS

This application claims the benefit of U.S. Provisional Application 61/359,012, filed Jun. 28, 2010, and is a continuation in part of U.S. application Ser. No. 12/952,949, filed Nov. 23, 2010 now U.S. Pat. No. 8,125,089, which is a continuation of U.S. application Ser. No. 11/586,468, filed Oct. 24, 2006, now U.S. Pat. No. 7,893,541 which claims the benefit of U.S. Provisional Application Nos. 60/798,016, filed May 4, 2006, and 60/730,161 filed Oct. 24, 2005, all of which are incorporated by reference herein.

The United States Government has rights in this invention pursuant to Contract No. W-7405-ENG-48 between the United States Department of Energy and the University of California for the operation of Lawrence Livermore National Laboratory.

II. FIELD OF THE INVENTION

The present invention relates to photoconductive switches and more particularly to an optically initiated silicon carbide (SiC) high voltage switch.

III. BACKGROUND OF THE INVENTION

Particle accelerators, such as for example dielectric wall accelerators (DWA), are critically dependent upon high voltage, high current, fast closing switches that can be activated with nanosecond precision. Photoconductive switches offer the most potential in terms of handling such high voltages and high currents with minimum inductance, rapid closure, precise temporal control and the possibility of long life. Photoconductive switching is a technique where optical energy is applied to a semiconductor material, and the optical energy creates carriers within the semiconductor which renders it conductive.

The materials that have been used to date for photoconductive switch applications include Silicon and Gallium Arsenide (GaAs). The difficulty with these materials is that various failure mechanisms occur even at modest parameters. Further, the optical absorption depth for these materials is low, thus the carriers are forced to flow in a very thin area of the material bulk just below the surface. Thus, the principal issue with photoconductive switching has been short lifetime resulting from overstressing current and voltage conditions.

Additionally, silicon carbide (SiC) has long been a promising alternative candidate for use as a photoconductive switch material. It is only very recently, however, has this particular material been made commercially available in sizes and purity that merit application as a high voltage switch. SiC material has high dielectric breakdown strength greater than that of most solid materials (~4MV/cm), has high thermal conductivity (comparable to that of copper), and low optical absorption. Thus with the availability of single crystalline Silicon Carbide, a new class of switches is possible.

While promising, even SiC is subject to failure due to high electric fields locally produced where the electrodes separate from contact with the photoconductive substrate. FIG. 1 shows a photoconductive switch known in the art having a SiC photoconductive substrate 10 and two opposing electrodes 11 and 12. FIG. 2 shows an enlarged view of the box A in FIG. 1 showing the meniscus formed at the metal contact between the electrode and substrate surfaces. FIG. 3 shows the magnitude of the electric field on the contact surfaces, and illustrating the spike in magnitude at the triple points. Various methods have been employed to reduce and minimize these fields at such "triple points," such as including filling the space between the electrode and substrate with a high permittivity material. This is shown in FIGS. 4-6. Similar to FIG. 1, FIG. 4 shows a SiC substrate 15 and two electrodes 16 and 17. Additionally, a high permittivity insulator 18 is filled into the space between the separation of the electrodes from the substrate. The meniscus 19 is shown in FIG. 5 at the triple point, where the triple point now includes the insulator material 18. FIG. 6, however, shows that there is still a spike, albeit with less magnitude, at the triple point of electrode-substrate separation.

What is needed therefore is a photoconductive switch for high voltage applications such as for particle accelerators, preferably implemented with a SiC material or other photoconductive materials, such as GaAs, that minimizes or at least reduces the high magnitude electric fields at the points of electrode-substrate separation.

IV. SUMMARY OF THE INVENTION

One aspect of the present invention includes a photoconductive switch comprising: a photoconductive substrate composed of a greater-than-1.6 eV wide band gap material, said substrate having at least one concavity(s), and a facet optically connectable to an optical source for receiving optical energy therefrom; and two electrodes electrically connected to the substrate with at least one of the electrodes having a convex surface contactedly seated in a corresponding one of the at least one concavity(s), for applying a potential across the substrate, wherein the concavity(s) of said substrate and the convex surfaces of the electrodes have a contoured profile selected from a group consisting of Rogowski, Bruce, Chang, Harrison, and Ernst profiles.

V. BRIEF DESCRIPTION OF THE DRAWINGS

The accompanying drawings, which are incorporated into and form a part of the disclosure, are as follows.

VI. DETAILED DESCRIPTION

Figure 1:
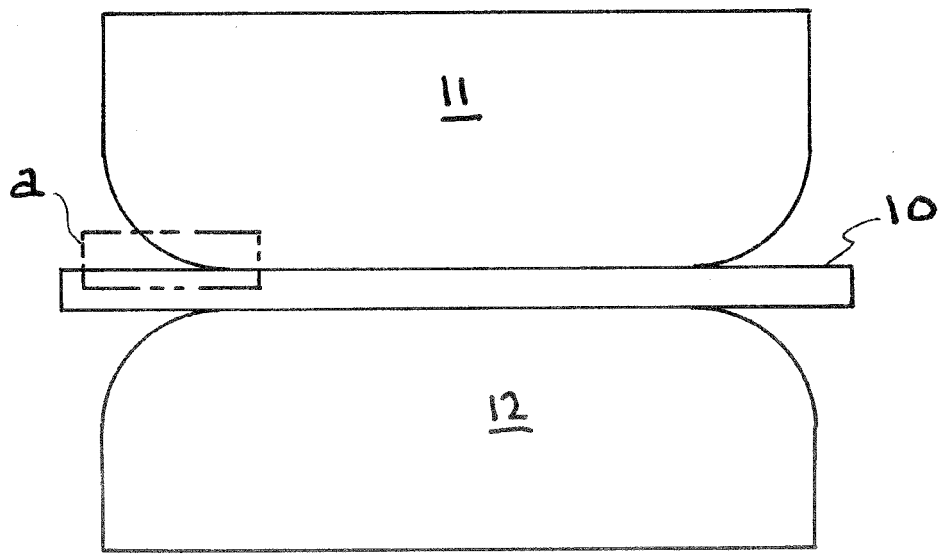
FIG. 1 is a side view of SiC photoconductive switch known in the art.
Figure 2:
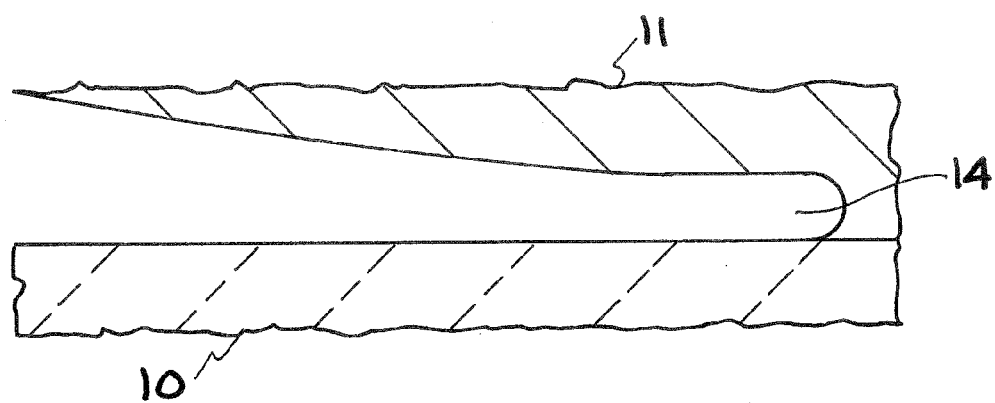
FIG. 2 is an enlarged side view of box A in FIG. 1 illustrating the meniscus formed at the triple point.
Figure 3:
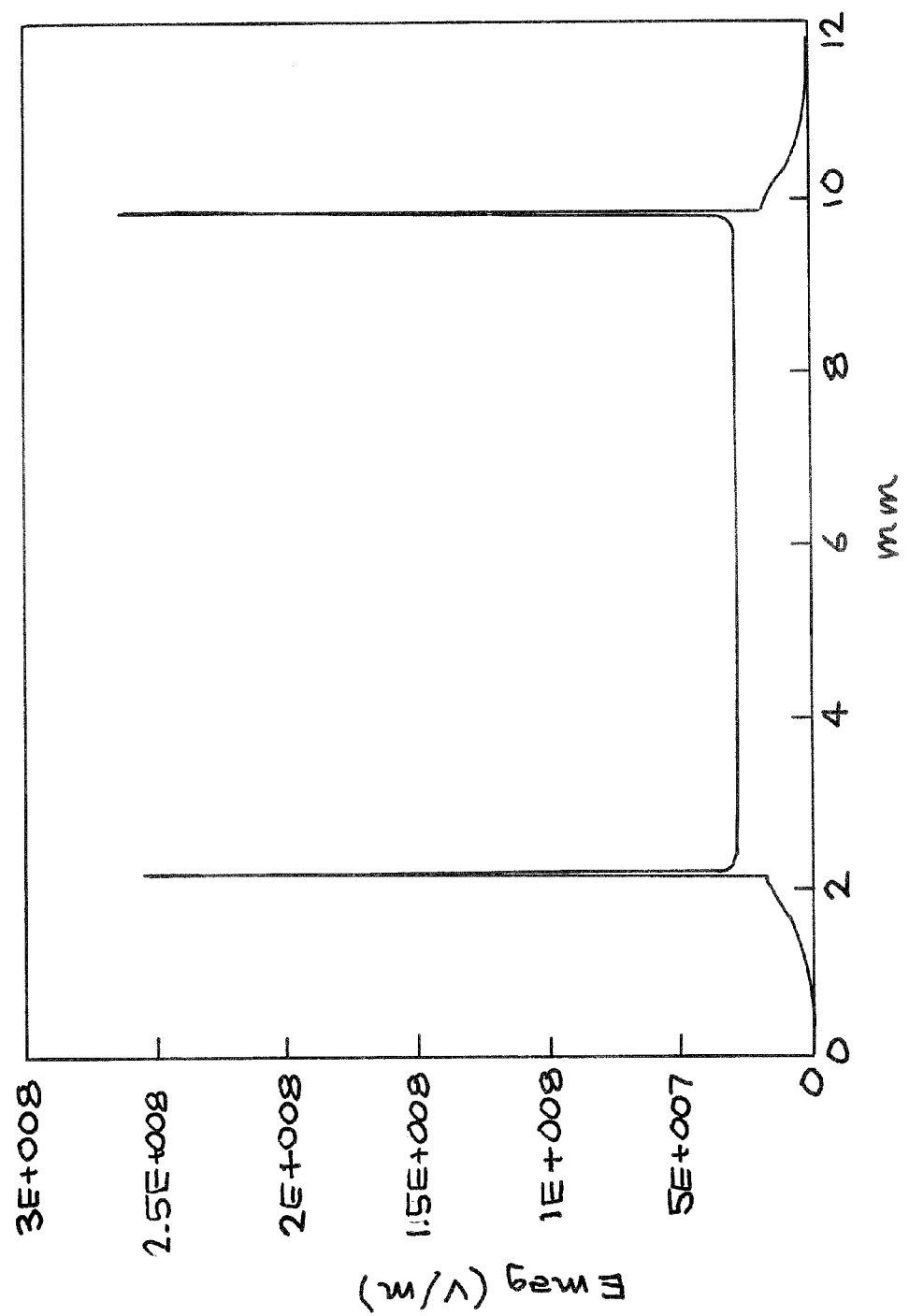
FIG. 3 is a graph showing the magnitude of the electric field along the interface of the SiC substrate and metal coating.
Figure 4:
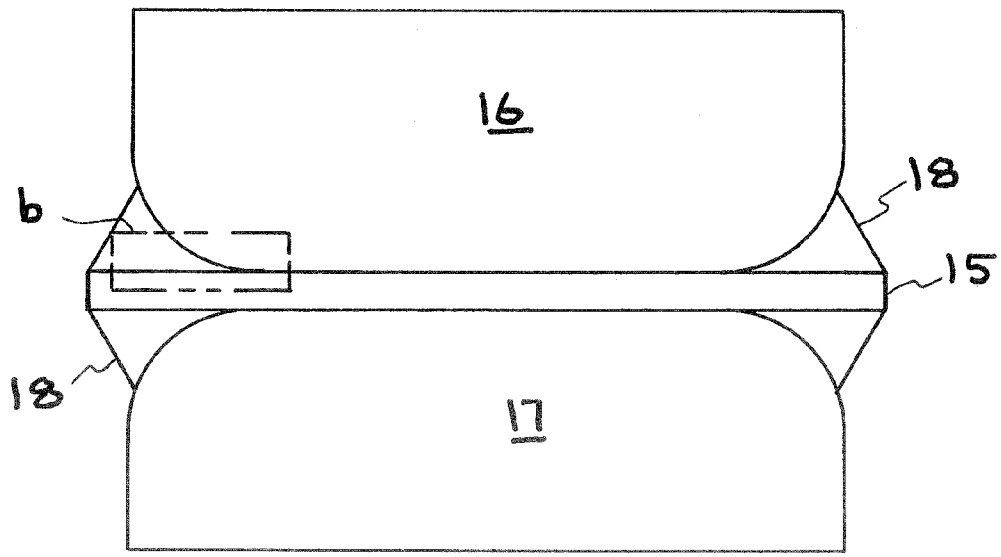
FIG. 4 is a side view of SiC photoconductive switch known in the art and similar to FIG. 1, and having a high permittivity insulator filling the space at the perimeter of the electrodes.
Figure 5:
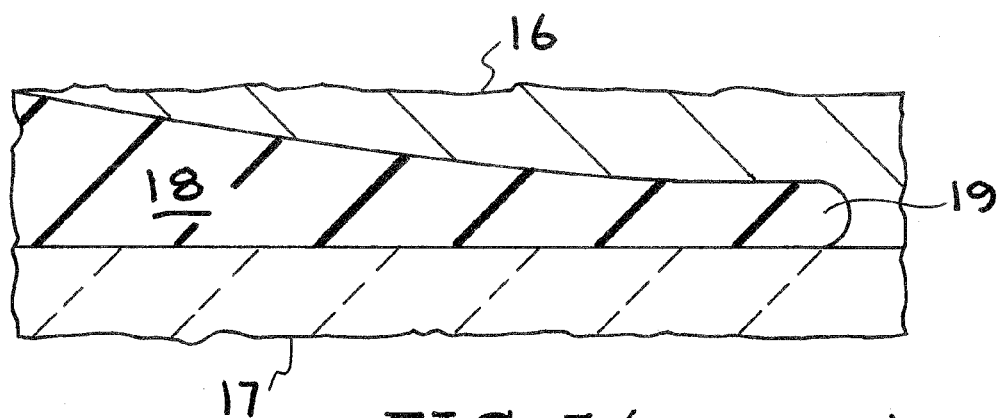
FIG. 5 is an enlarged side view of box B in FIG. 4 illustrating the meniscus formed at the triple point, now including the insulator.
Figure 6:
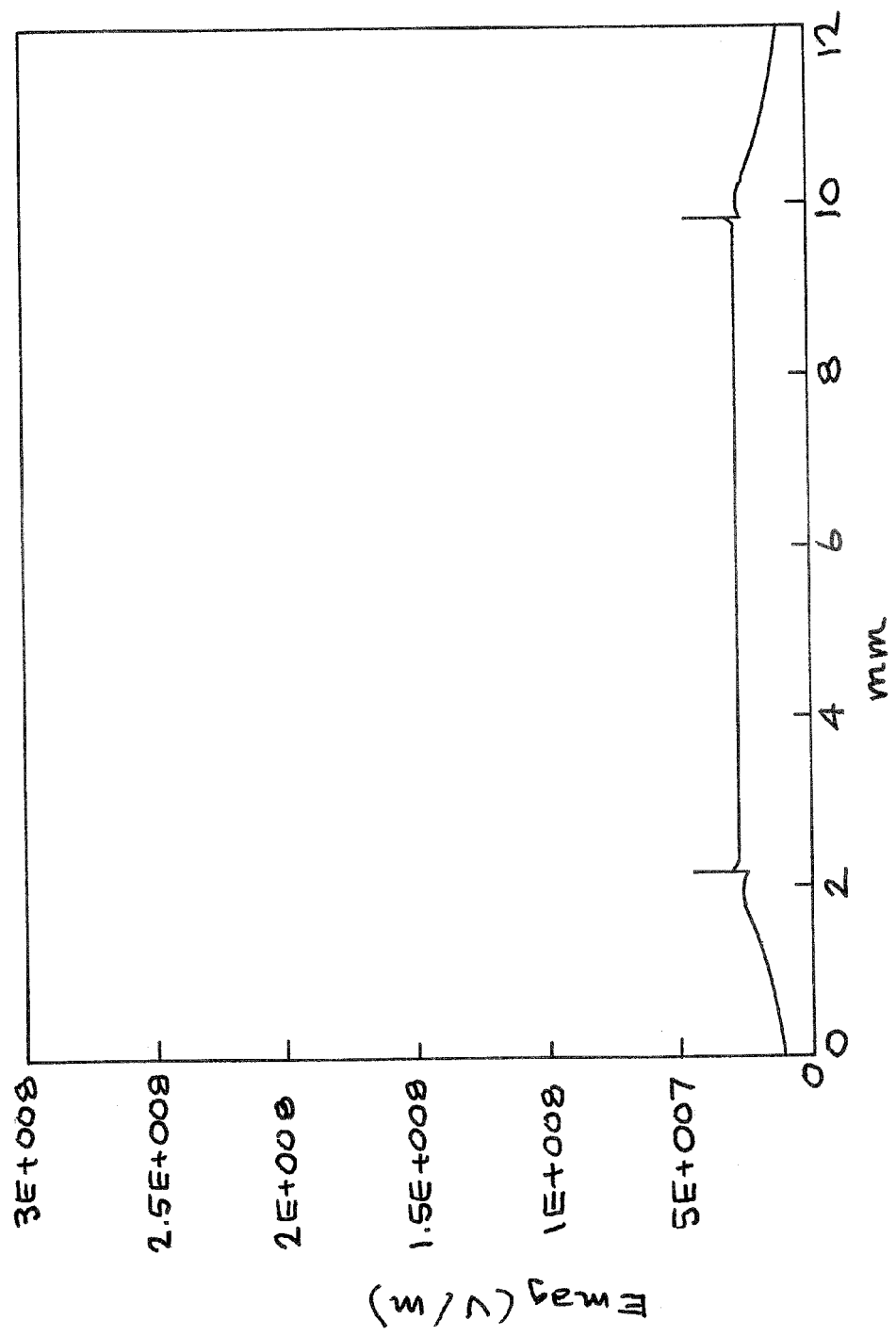
FIG. 6 is a graph showing the magnitude of the electric field along the interface of the SiC substrate, metal coating, and high permittivity insulator.
Figure 7:
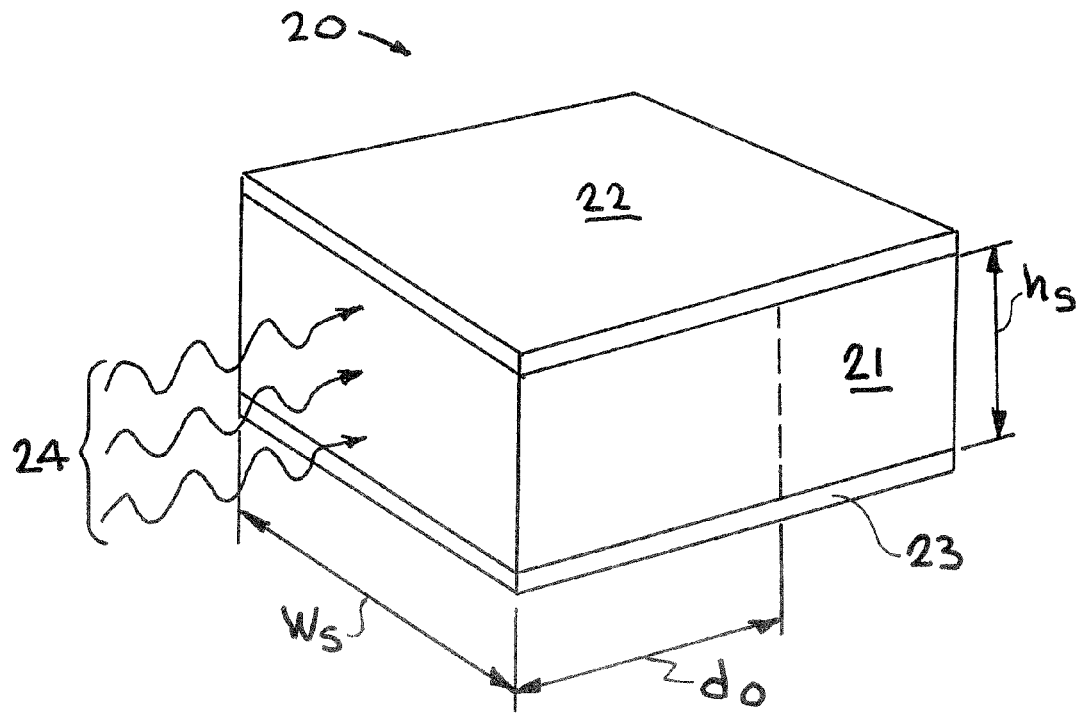
FIG. 7 is a perspective view of a basic photoconductive switch.

The photoconductive switch of the present invention improves upon the basic photoconductive switch construction and operation shown in FIG. 7, with enhancements enabling the switch to handle high voltages and high currents with minimum inductance, rapid closure, precise temporal control and the possibility of long life. As such, the photoconductive switch of the present invention shares much the same construction as a basic photoconductive switch shown in FIG. 7 generally having a photoconductive material 21 between two electrodes 22 and 23. Without optical energy injection, i.e. in the dark, the photo-conductive material is an insulator with a large resistance value (much larger than the circuit impedance) and thus the switch essentially blocks current flow. When optical energy is injected and absorbed in the photoconductive material, the switch resistance drops to a small value (much less than the circuit impedance) and the switch conducts current. Thus the basic photoconductive switch is essentially an optically controlled resistance. The availability of relatively small pulsed lasers or other optical sources enable the injection of optical energy in a short pulse so that the switching time between large blocking resistance and small conduction resistance can easily be several nanoseconds.

There are several physical embodiments or geometries of photoconductive switches one of which is illustrated in FIG. 7, in which the contacts or electrodes are placed in relation to the semiconductor material. The geometry of the switch (electrodes and semiconductor material) is determined by the method in which the optical energy is applied to the switch and the mode of photoconductivity employed in switch operation. The mode of photo-conductivity, intrinsic or extrinsic, is dependent upon the ratio of the photon energy to the band gap energy in the semiconductor. In an intrinsic photo-conductor, the photon energy is greater than the semiconductor band gap energy. In the intrinsic case, the optical absorption depth or the depth, which the optical energy can penetrate, is very small and on the order of tens of microns. In the extrinsic mode, the photon energy is less than the band gap energy of the semiconductor and the optical energy can penetrate to much large depths, dependent upon the active dopant and defect densities in the semiconductor.

These two modes of photoconductivity are further operated in linear and non-linear switch systems. In a linear photoconductive switch, each absorbed photon produces one electron and one electron vacancy or hole, referred to as an electron-hole pair. The electron and hole density is made sufficient to reduce the switch resistance to the desired conduction value by injecting sufficient optical energy. Furthermore, the rate at which the switch closes is dependent upon the rate at which the optical energy is injected into the switch volume such that the closure time is approximately equal to the optical pulse width. The current density in a linear photoswitch is determined by the distribution of the optical energy in the switch volume.

In the present invention, the linear, extrinsic mode of operation is preferred because the optical absorption depth and thus the dimensions of the conducting cross section can be tailored by the controlling the density of interband dopants. However, the inventions is not limited only to such. The density of interband dopants also determines the maximum density of current carriers (electrons and holes) and thus current density at which conduction is possible (the current density is self limiting if the linear mode of operation). The linear mode of operation requires that each current carrier pair be produced by a photon and does not rely on internal avalanche processes that have shown to produce extremely dense current filaments that damage contacts and bulk materials.

Preferably, the photoconductive switch of the present invention uses compensated, Semi-Insulating Silicon Carbide (CSI-SiC) as the photoconductive substrate, since it is considered the best material for application in high power photo-conductive switch applications. This is due to the following reasons. First, CSI-SiCs very large dielectric strength (3 MV/m) which permits very thin layers to support large voltages (GaAs can only support ~250 kV/cm). CSI-SiC switches require reduced levels of optical closure energy since the required optical closure energy scales as the thickness of the CSI-SiC material. CSI-SiC's large dark resistance ($10^{11}$-$10^{15}$ Ohm-cm) which permits low rates of voltage application or charging (maximum GaAs resistivity ~$10^9$ Ohm-cm). CSI-SiC's large thermal conductivity which permits high average power operation without thermally induced conduction (GaAs thermal conductivity is only 10% of SiC). And the compensated nature of CSI-SiC's enables the design of recombination times, optical absorption depths, and thus current densities.

The substrate is a compensated, semi-insulating material selected from a group consisting of 4h SiC, 6h SiC, and GaN. Preferably having a hexagonal crystal structure and cut in a plane selected from the group consisting of the A-Plane, C-Plane and M-plane. With multiple laminated layers so reduce the length of the micropipes. The semi-insulating SiC is preferably doped with at least one of the following dopants: Boron, Vanadium, Nitrogen, Aluminum, Phosphorus, Oxygen, Tungsten and Zinc. And preferably at least one non-electroded facet of the substrate is coated with a dielectric to produce total internal reflection.

Figure 8:
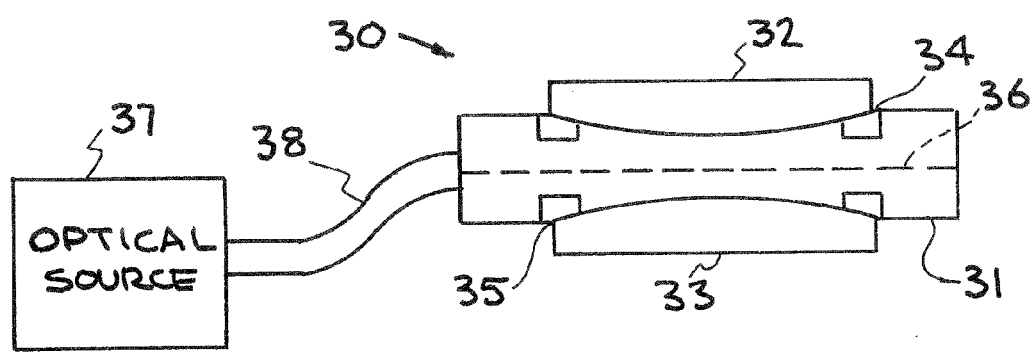
FIG. 8 is a schematic view of an illustrative embodiment of the photoconductive switch of the present invention used in a switching system.

FIG. 8 shows a schematic view of and exemplary embodiment of the photoconductive switch 30 of the present invention, connected to an optical source 37, such as a laser via a optic fiber 38. It includes a photoconductive substrate 31 having two electrodes 32 and 33 (preferably opposing, but not necessary) electrically connected to the substrate. Furthermore, there are field-grading liners 34 and 35 shown formed on the substrate to grade the electric field.

Figure 9:
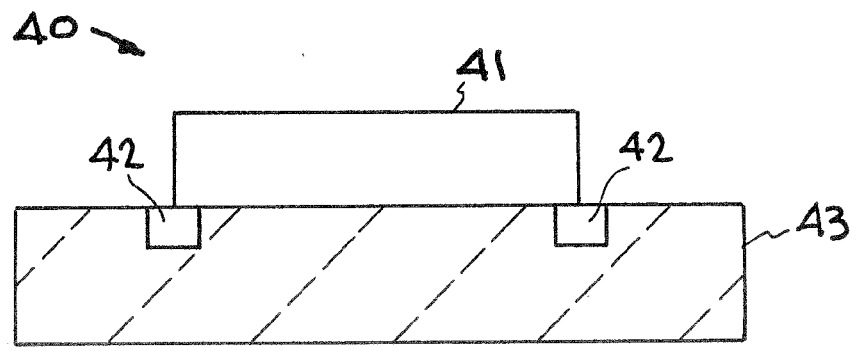
FIG. 9 is a cross-sectional view of an upper half of a first exemplary embodiment of the photoconductive switch of the present invention, showing the electrical connection between an upper electrode and the photoconductive substrate.
Figure 10:
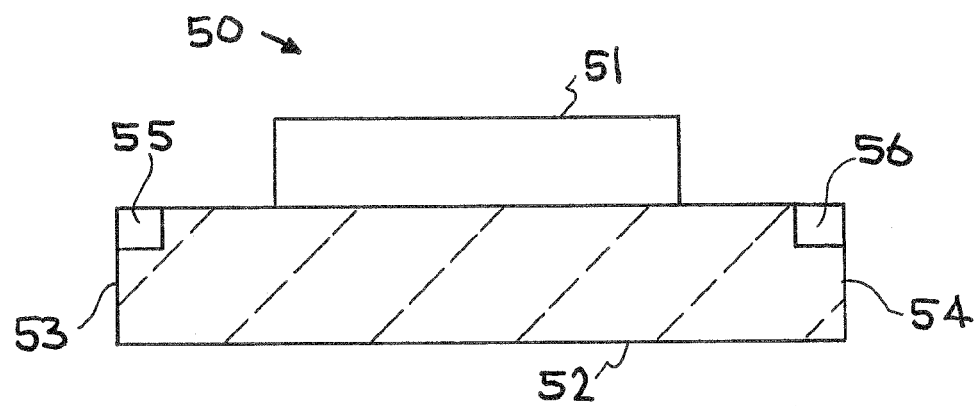
FIG. 10 is a cross-sectional view of an upper half of a second exemplary embodiment of the photoconductive switch of the present invention.
Figure 11:
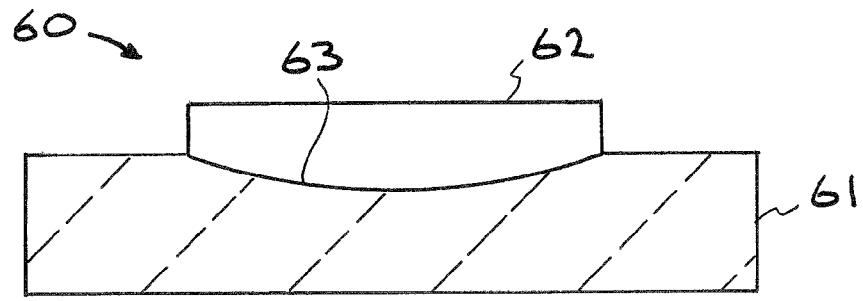
FIG. 11 is a cross-sectional view of an upper half of a third exemplary embodiment of the photoconductive switch of the present invention.
Figure 12:
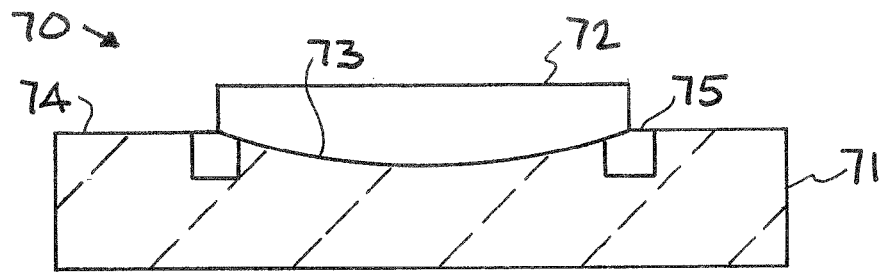
FIG. 12 is a cross-sectional view of an upper half of a fourth exemplary embodiment of the photoconductive switch of the present invention.
Figure 13:
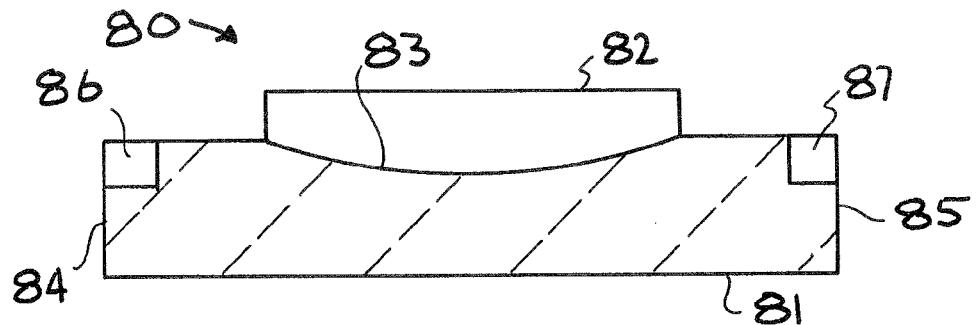
FIG. 13 is a cross-sectional view of an upper half of a fifth exemplary embodiment of the photoconductive switch of the present invention.

FIGS. 9-13 show various embodiments of the electrical connection between the electrodes and an electrode-contacting surface of the substrate (e.g. 63 in FIG. 11). FIG. 9 shows the electrode-contacting surface being a plane and the liners 42 recessed below the substrate. And liners 42 between the substrate and the electrode perimeter. FIG. 10 shows the liners 55, 56 adjacent the substrate perimeter/ends. FIG. 11 shows the electrode-contacting surface having two opposing concavities for seating a convex electrode 62. The electrode-contacting surface 63 is therefore also concave. FIG. 12 shows a similar switch construction of FIG. 11, also including liner 75 between the electrode perimeter and the substrate. And FIG. 13 shows a similar construction as FIG. 12 with the liners adjacent the substrate perimeter.

The photoconductive switch preferably comprises a photoconductive substrate composed of a greater-than-1.6 eV wide band gap material, said substrate having two opposing concavities, and a facet optically connectable to an optical source for receiving optical energy therefrom; and two electrodes having convex surfaces contactedly seated in the two concavities, for applying a potential across the substrate.

Furthermore, at least one field-grading liners formed on the substrate surrounding a corresponding one of the electrode-contacting surfaces, for grading the electric fields therealong. The two field-grading liners are adjacent the electrode perimeters. Also, wherein the two field-grading liners form the rims of the two concavities for grading the electric fields at the separations of the electrodes from the substrate. Preferably the field-grading liners are integrally formed on the substrate.

Preferred material for the field-grading liners are a high permittivity material, or either conductive and semi-conductive materials. Preferably it is composed of silicon nitride. Ehe conductive or semi-conductive material may be formed as a doped sub-surface layer of the substrate, extending into the substrate about 1 micron deep. Optionally, the substrate is a multilayer having at least two photoconductive layers separated by a divider layer, with the divider layer composed of conductive and semi-conductive materials.

Also the photoconductive substrate composed of a greater-than-1.6 eV wide band gap material, said substrate having opposing electrode-contacting surfaces and a facet optically connectable to an optical source for receiving optical energy therefrom; two electrodes electrically connected to the electrode-contacting surfaces of the substrate, for applying a potential across the substrate; and two field-grading liners formed on the substrate surrounding the electrode-contacting surfaces, for grading the electric fields therealong. In the case where the field-grading liners are adjacent the electrode perimeters, the field-grading liners are preferably formed between the substrate and the electrode perimeters. Also, the two field-grading liners are recessed below the level of the electrode-contacting surfaces. Wherein outer surfaces of the field-grading liners are coplanar with the electrode-contacting surfaces to form extensions thereof. Wherein the field-grading liners are adjacent the substrate perimeter.

Figure 14:
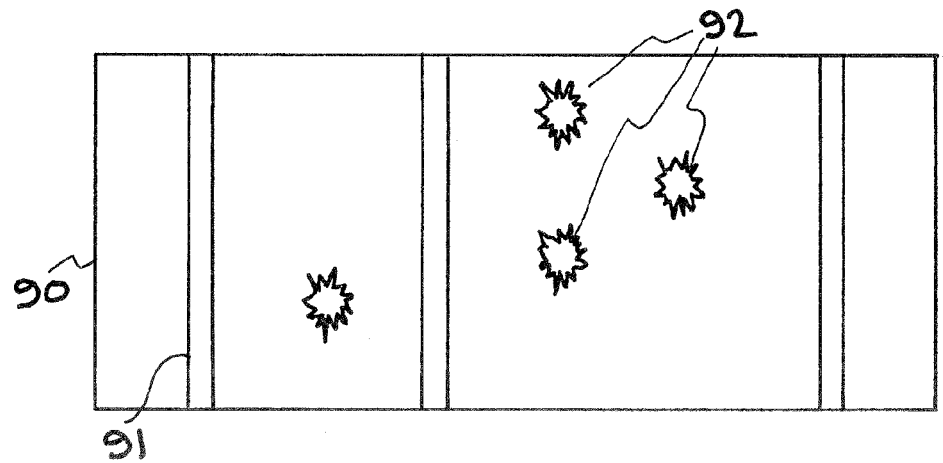
FIG. 14 is a cross-sectional view of a plane of a SiC substrate showing imperfections within the structure such as voids, fractures, and micropipes.

In most substrates, there are imperfections within the structure, such as shown in FIG. 14. These imperfections 92 can include voids, fractures, and the like. In a particular plane of SiC such as shown at 90, these voids can also include "micropipes," such as shown at 91. That is long and narrow tubular voids through the full length of the substrate. When high voltage is applied to the substrate, arc breakdown can occur through the full length of the device either by connecting through the voids or completely through the micropipes. It is well known to those skilled in the art that breakdown occurs in a void by the acceleration and collision of charge particles created within the void by ionization. The collisions create ion-electron pairs which further contribute to the process until a full avalanche i.e., arc occurs. It is also well known that the shorter the charge particles can travel, the less energy they receive, and the less likely an avalanche can occur. Thus small void can have less of an effect than a large void. Eliminating all voids is a difficult and expensive process.

Figure 15:
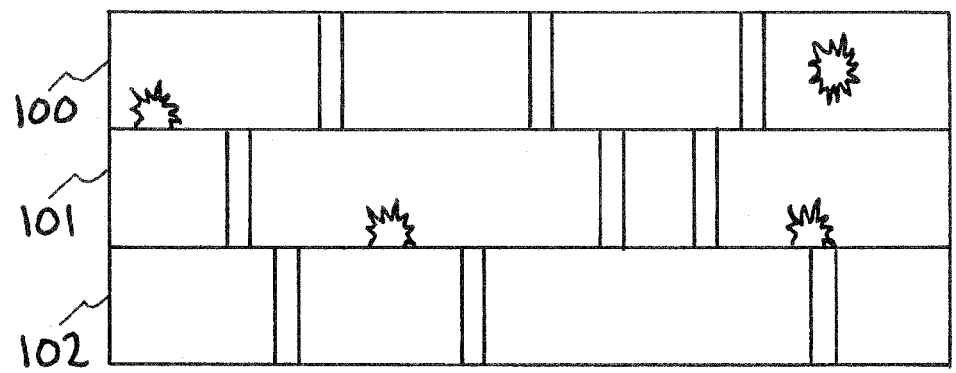
FIG. 15 is a cross-sectional view of a laminated structure of a SiC substrate of the photoconductive switch of the present invention for isolating voids and fractures and preventing micropipes from making a full connection through the entirety of the substrate thickness.

Thus an enhancement for isolating voids and reducing their scale size is shown in FIG. 15 of the present invention. In this structure, the substrate is made into a laminated structure, such as three layers 100-102. Micropipes no longer can make a full connection through the entirety of the substrate thickness. Further, the majority of voids can be made smaller.

Figure 16:
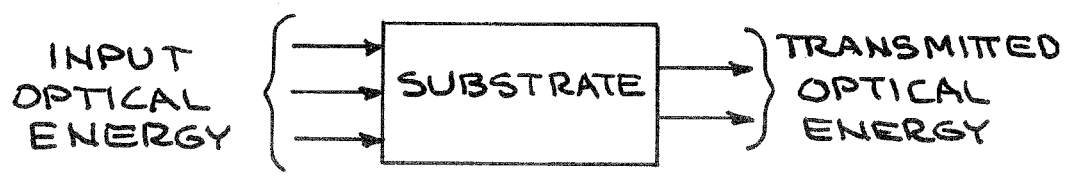
FIG. 16 is a schematic illustration of how substrates are very transparent to the optical energy that is used to transition them from the non-conducting to conducting state, and how input optical energy can be wasted.
Figure 17:
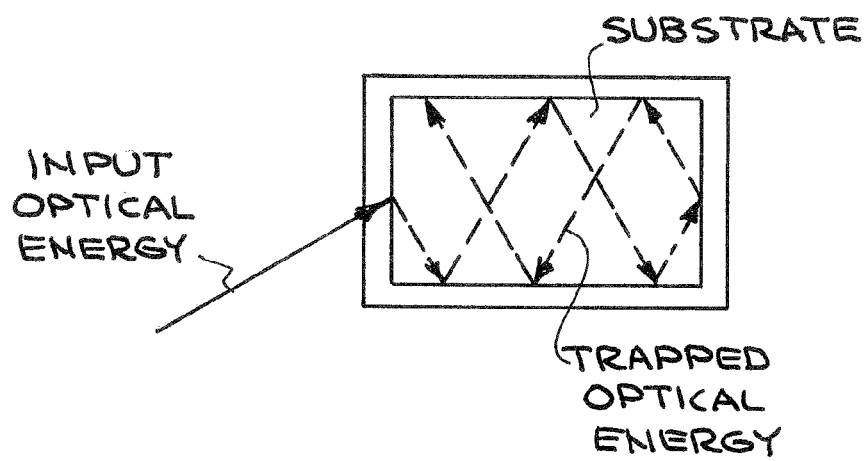
FIG. 17 is a schematic view of an exemplary embodiment of a switch of the present invention having a coating to contain all the admitted optical energy.

Many substrates are very transparent to the optical energy that is used to transition them from the non-conducting to conducting state, as shown in FIG. 16. Optical absorption depths are on the order of 1 cm for approximately 1 micron light. As a result, in an optically short switch, the majority of the input optical energy is wasted. Substrates can be expensive and thus an optically long switch would be expensive to be efficient. As a result, operating a large array of these switches in perhaps an accelerator, could become prohibitive because of cost. As shown in FIG. 17, an exemplary embodiment of the present invention makes the switch into a cavity which contains all the admitted optical energy. This is accomplished by a means, such as a dielectric coating shown in FIG. 17, whereby the substrate scale can be made small and optimization of the device size can be focused on the electrical requirements such as current density through the switch.

An example fabrication process for integrally forming the field-grading liners in a 6H-Sic substrate, for example, is as follows. First RCA clean 6H—SiC substrates. Then plasma-enhanced chemical vapor deposition or PECVD growth at 350 C of 0.5 um Silicon Nitride layer over surface of 6H—SiC substrates. High temperature (1200 C) growth of 1 um thick thermal oxide (SiO2) layer over surface Nitride layer. Reactive ion etch through SiO2 and Si3N4 layers and approximately 1-2 um into 6H—SiC substrate surface. Reactive ion etch using SF6-O2 gas will result in a radiused profile at the edge of the pattern etched through SiO2, Si3N4 and into SiC. Next, contact metal layers are deposited directly over etched pattern such that the high fields at the edge of metalization are pushed into thermal SiO2 layer. Thermal oxide layer has a critical field strength three thimes higher than 6H—SiC.

It is appreciated that RCA clean is the industry standard for removing contaminants from wafers. Contaminants present on the surface of silicon wafers at the start of processing, or accumulated during processing, have to be removed at specific processing steps in order to obtain high performance and high reliability semiconductor devices, and to prevent contamination of process equipment, especially the high temperature oxidation, diffusion, and deposition tubes. The RCA cleaning procedure has three major steps used sequentially: First there is organic cleaning involving the removal of insoluble organic contaminants with a 5:1:1 $H_2O$: H2O2: NH4OH solution. Next there is oxide stripping involving the removal of a thin silicon dioxide layer where metallic contaminants may accumulated as a result of (I), using a diluted $H_2O$:HF solution. And finally, there is ionic cleaning involving the removal of ionic and heavy metal atomic contaminants using a solution of 6:1:1 H₂O: H2O2: HCl.

Figure 18:
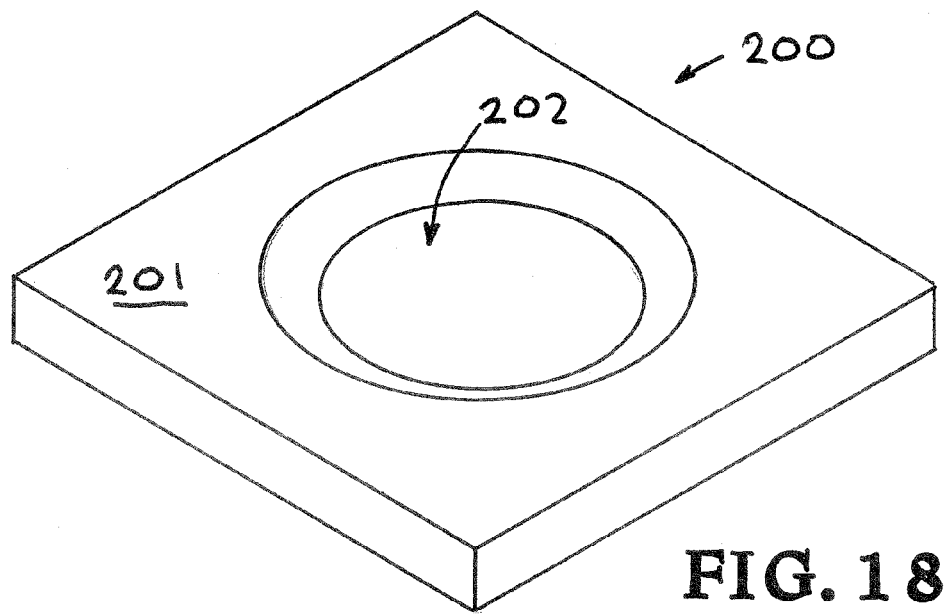
FIG. 18 is a perspective view of a SiC substrate having a concave surface with an example Rogowski profile for $\psi=0.67\pi$ (108 degrees).
Figure 19:
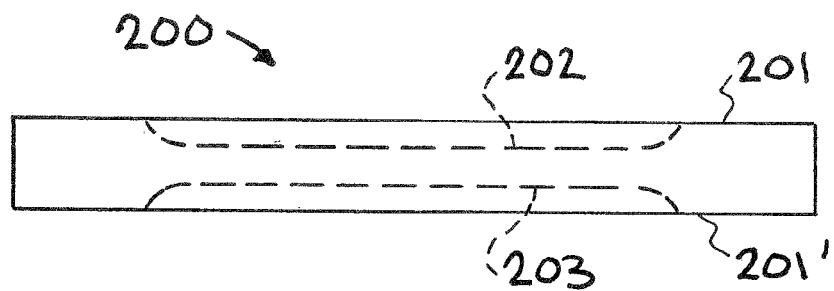
FIG. 19 is a cross-sectional view of the substrate with Rogowski profile of FIG. 18.
Figure 20:
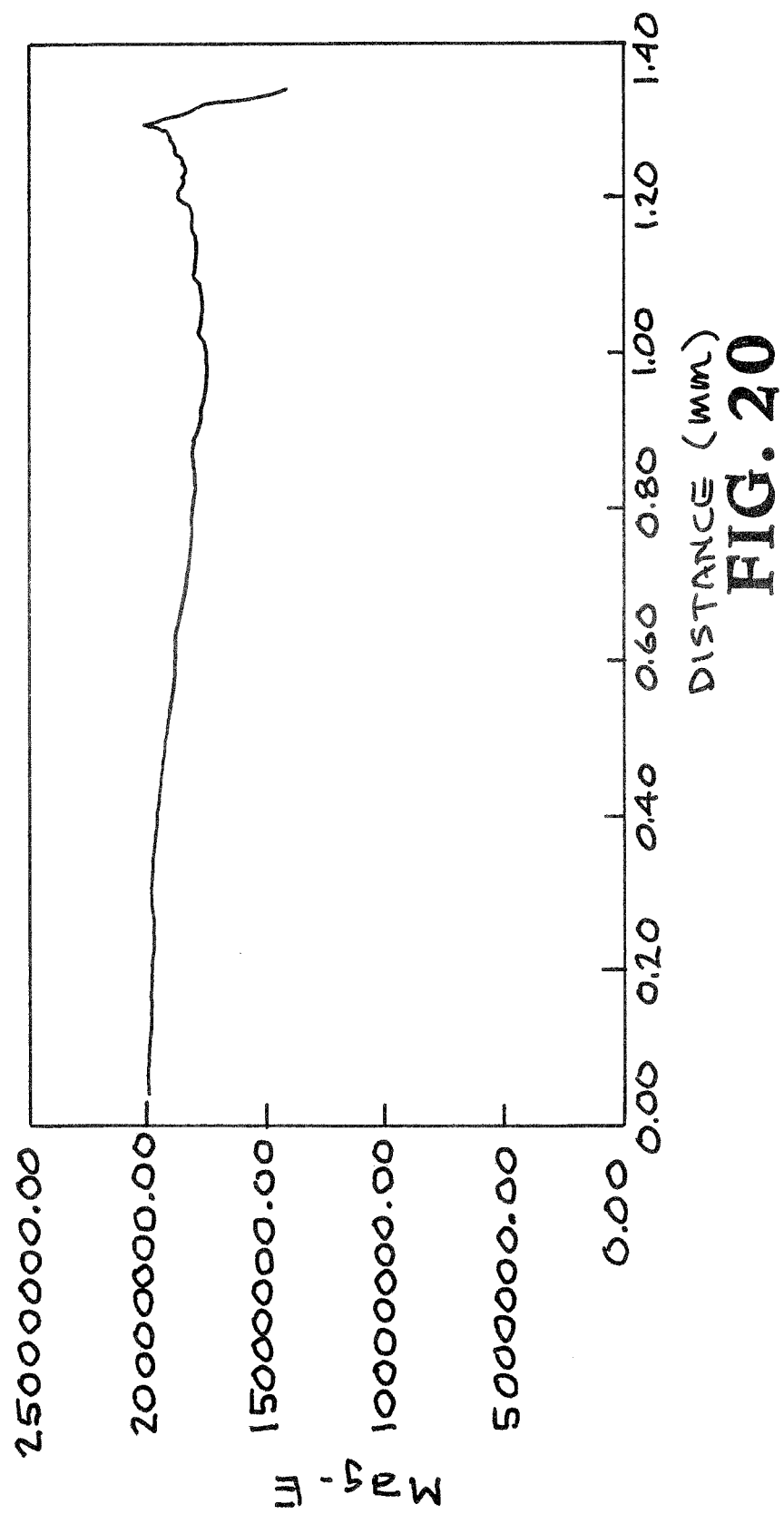
FIG. 20 is an example electric field plot for the Rogowski profile of FIGS. 18 and 19.

FIGS. 18-20 show another exemplary embodiment of the photo-conductive switch of the present invention having a contoured interface between the photo-conductive wafer and the electrodes that is characterized by one of the Rogowski, Bruce, Harrison, Chang, and Ernst profiles known in the art. The "Rogowski profile" is described in the article "The Electric Field at the Edges of Plate Condensers", by W. Rogowski, Arch. F. Elekt., Vol. 12, No. 1, (1923), incorporated by reference herein. The "Bruce profile" is described in the article, "Calibration of Uniform-field Spark-gaps for High Voltage Measurements at Power Frequencies" by F. M. Bruce, Jour. IEEE Vol. 94, page 138 (1947), incorporated by reference herein. The "Harrison profile" is described in the article, "A Computer Study of Uniform-field Electrodes" by J. A. Harrison, Br. J. Appl. Phys. Vol. 18, Number 11, page 1617 (1967), incorporated by reference herein. The "Chang profile" is described in the article, "Improved Uniform-Field Electrode Profiles for TEA Laser and High-Voltage Applications" by T. Y. Chang, Rev. Sci. Instrum., Vol. 44, page 405 (1973), incorporated by reference herein. And the "Ernst profile" is described in the article, "Uniform-field Electrodes with Minimum Width" by Gerard J. Ernst, Optics Communications, Vol. 49, No. 4, pages 275-277 (1984), incorporated by reference herein.

In particular, in the present invention two opposing profiled concavities are formed on the photo-conductive substrate/wafer, and the electrodes are formed with profiled convex mating surfaces. The photo-conductive substrate also has at least one light input surface or facet that is optically connectable to an optical source for receiving optical energy. The contoured profile is used to reduce the overall maximum (peak) electric fields occurring in extrinsic wide bandgap semiconductor, photo-conductive switches. In particular, the peak electric fields occur at enhancement points at the edges of electrodes deposited on wide bandgap semiconductor substrates (wafers) which are used to fabricate high voltage photo-conductive switches. These enhancement points are mitigated in the present invention by changing the contour of the electrode interface of the wide bandgap photo-conductive switch substrate to have, for example, a Rogowski profile. In this manner, the maximum electric field may be designed to occur near the center of the device well away from the electrode edge, and thereby enables such switches to operate at higher average electric fields. As previously discussed, the photo-conductive substrate may be compensated, semi-insulating material such as for example 4h SiC, 6h SiC, or GaN.

Various methods may be employed to form the concave and convex configurations of the wafer and electrodes, respectively, such as for example but not limited to, machining, lapping, polishing, grinding, wet etching, dry etching, plasma enhanced etching, ECRH etching, reactive ion etching, ion beam etching, laser ablation and focused ion beam etching.

FIGS. 18 and 19 in particular shows an example case of a photo-conductive switch with a Rogowski profiled concavity for ψ=0.67π (108 degrees) in a SiC photoconductive wafer substrate, indicated at reference character 200. Two concavities 202 and 203 are shown machined or otherwise formed on surfaces 201 and 201', respectively. As can be seen in FIG. 18, the substrate thickness between the concavities is about half of the original substrate thickness. And FIG. 20 shows an example electric field plot for the Rogowski profile of FIGS. 18 and 19. In particular, electric field versus distance from substrate axis is plotted along Rogowski profile. And field enhancements are approximately equal to unity, or less.

While particular operational sequences, materials, temperatures, parameters, and particular embodiments have been described and or illustrated, such are not intended to be limiting. Modifications and changes may become apparent to those skilled in the art, and it is intended that the invention be limited only by the scope of the appended claims.

We claim:
1. A photoconductive switch comprising:
a photoconductive substrate composed of a greater-than-1.6 eV wide band gap material, said substrate having at least one concavity(s), and a facet optically connectable to an optical source for receiving optical energy therefrom; and
two electrodes electrically connected to the substrate with at least one of the electrodes having a convex surface contactedly seated in a corresponding one of the at least one concavity(s), for applying a potential across the substrate,
wherein the concavity(s) of said substrate and the convex surfaces of the electrodes have a contoured profile selected from a group consisting of Rogowski, Bruce, Chang, Harrison, and Ernst profiles.
2. The photoconductive switch of claim 1,
wherein the substrate is a compensated, semi-insulating material selected from a group consisting of 4h SiC, 6h SiC, and GaN.

* * * * *